United States Patent [19]

Figler et al.

[11] 4,418,312

[45] Nov. 29, 1983

[54] APPARATUS FOR TESTING MULTI-CONDUCTOR CABLES

[75] Inventors: Bernard A. Figler, Aberdeen Township, Monmouth County; Charles M. Fingerman, Manchester Township, Ocean County, both of N.J.

[73] Assignee: Bell Telephone Laboratories, Incorporated, Murray Hill, N.J.

[21] Appl. No.: 314,245

[22] Filed: Oct. 23, 1981

[51] Int. Cl.³ .............................................. G01R 31/08
[52] U.S. Cl. ....................................... 324/52; 340/514
[58] Field of Search .............. 324/51, 52; 340/815.02, 340/815.03, 514

[56] References Cited

FOREIGN PATENT DOCUMENTS

| 3003600 | 8/1981 | Fed. Rep. of Germany ...... 340/514 |
| 53-89677 | 8/1978 | Japan ..................................... 324/51 |
| 543968 | 1/1977 | U.S.S.R. ............................... 340/514 |
| 684575 | 9/1979 | U.S.S.R. ............................... 340/514 |
| 739439 | 6/1980 | U.S.S.R. ............................... 324/51 |

OTHER PUBLICATIONS

Graham, "Logic Circuit Tests Wiring Assemblies", Electronics, Dec. 25, 1975, p. 86.

Primary Examiner—Stanley T. Krawczewicz
Assistant Examiner—Jose M. Solis
Attorney, Agent, or Firm—Roy C. Lipton

[57] ABSTRACT

Apparatus for testing multi-conductor cables for wiring errors, illustratively open, shorted or crossed conductors, is described. This apparatus, at the so-called far end of the cable, establishes a conduction path between all of the conductors, and, at the so-called near end, sequentially selects one of $n-1$ of the n conductors comprising the multi-conductor cable and establishes a conduction path between it and the $n^{th}$ conductor. As a result, a test loop is defined which at any one instant is comprised of only two conductors: the selected conductor and the $n^{th}$ conductor, wherein the latter serves as a fixed return path. At the near end, the apparatus applies a pulse of test current to each test loop in succession which, if the selected conductor comprising that loop is correctly wired, flashes a corresponding indicator located in the apparatus at the far end.

4 Claims, 2 Drawing Figures

APPARATUS FOR TESTING MULTI-CONDUCTOR CABLES

BACKGROUND OF THE INVENTION

1. Field of the Invention

The invention relates to an improved arrangement for testing long, installed cables which contain multiple conductors.

2. Description of the Prior Art

Electrical cables having multiple conductors, so-called multi-conductor cable, are extensively used in electronic systems to interconnect various electrical subassemblies or subsystems. Frequently, for example, in the interconnection of two telephone switching offices, an installer first runs multi-conductor cable between two locations and then attaches a connector to each end of the cable. These connectors mate with corresponding connectors on the equipment which is to be interconnected by the cable.

Each connector is comprised of a plurality of pins or terminals. An installer attaches each pin, usually by soldering, to a respective conductor in the cable. During this procedure, wiring errors are often made. These wiring errors or conduction faults typically include: open conductors, i.e., those which are physically, but not electrically, attached to corresponding pins in the connector; conductors shorted to others, illustratively caused by solder bridging between a number of adjacent pins, and crossed conductors, i.e., those which are wired to wrong pins on the connector. These errors, if left uncorrected, can, by applying a signal to a wrong pin, seriously damage any equipment to which the cable is connected.

To accurately test a cable for wiring errors, every conductor must be tested against every other conductor. One traditional technique for doing this involves "ringing out" the cable until all the errors are found. In particular, once both connectors have been attached to the cable, an installer then connects one probe of an ohmmeter, buzzer or similar test instrument, to a pin of one connector. The installer then successively touches the other probe of the test instrument to every other pin in the same connector to see if the instrument indicates current flow and thus indicates a wiring error involving that first pin. Thereafter, the installer moves the first probe to another pin and repeats the entire procedure. Since a multi-conductor cable having as little as 10 to 20 conductors may require more than several thousand separate tests, and because a good deal of time is required to move the probes from pin to pin, this technique wastes a considerable amount of time.

Various suggestions have been put forth in the art to substantially reduce the time required to test a multi-conductor cable. However, each suggestions has its own peculiar disadvantages if it is used to test a long, installed multi-conductor cable.

For example, U.S. Pat. No. 2,904,750 (issued on Sept. 15, 1959 to E. P. Gargani et al) discloses an arrangement which tests a multi-conductor cable by applying a voltage level to one end of a selected conductor and, if detected at the other end, using that level to advance the position of a relay armature such that that level is applied to another conductor. The relay stops advancing whenever a wiring error is found. Unfortunately, with this arrangement, both ends of the cable under test must be brought to a single location. Hence, this arrangement cannot be used if both ends of an installed cable are separated by a large distance.

Another suggestion is typified by the arrangement shown in U.S. Pat. No. 2,964,701 (issued on Dec. 13, 1960 to M. L. Argabright). With this arrangement, an adapter, attached to one end of the cable, connects each of the conductors in the cable in series. The other end of the cable is connected, as one leg, to a four-leg balanced bridge network. A balance is achieved if none of the conductors is shorted together or crossed. While this arrangement eliminates the need to bring both connectors of the cable to a single testing location, this arrangement is not able to determine which particular conductors are incorrectly wired and the exact nature of the wiring error, i.e., whether it is an open, shorted or crossed conductor.

Another suggestion is the arrangement disclosed in U.S. Pat. No. 3,217,244 (issued on Nov. 9, 1965 to G. G. Glover). In this arrangement, an adapter is connected to one end, illustratively the far end, of the cable under test. This adapter contains as many separate indicators as there are conductors. Within this adapter, one side of an indicator, typically a lamp, is wired in series, via a mating connector, with a respective conductor in the cable. The other side of all the lamps is wired together. At the other end of the cable, i.e., the near end, this arrangement selects a particular conductor and applies test current to it in an amount sufficient to light a corresponding indicator in the adapter. All the remaining conductors in the cable are used as the return path for the lit indicator. If the returning test current is unevenly distributed among these remaining conductors, this may disadvantageously cause an erroneous indication. Specifically, if one conductor in the return path or its associated indicator has a low resistance with respect to the others, then the test current flowing through that conductor will be relatively high and that indicator in the return path may light. Since this indicator will light simultaneously with the one wired in series with the selected conductor, the installer will interpret this indication to mean that both conductors are shorted together—when in fact they are not.

A further solution is the arrangement disclosed in U.S. Pat. No. 3,825,824 (issued July 23, 1974 to R. G. Herron et al.). Here, the test current is applied at the near end to only one conductor at a time in an amount sufficient to light a corresponding indicator located at the far end. However, a separate source of power must be applied to the apparatus positioned at both ends of the cable. Moreover, the return path disadvantageously lies outside the cable. Consequently, if a long, installed multi-conductor telephone cable is to be tested, a conductor, located outside the cable and terminating at the same physical locations as both ends of the cable under test, must be found for use as the return path. "Free" conductors of this sort can rarely be found in telephone applications and oftentimes power supplies are not available at both ends of a long installed telephone cable. Thus, this apparatus can not be readily used to test typical long installed multi-conductor telephone cable.

SUMMARY OF THE INVENTION

Accordingly, one object of this invention is to provide an arrangement for testing a long installed multi-conductor cable for wiring errors in a minimum amount of time.

An additional object of this invention is to provide an arrangement for testing cable without requiring that both its ends be brought to a single location.

An additional object of this invention is to provide an arrangement for testing cable which specifies which conductors are incorrectly wired, and the precise nature of the wiring error, i.e., whether it is a shorted, open or crossed conductor.

A further object of this invention is to provide an arrangement for testing cables which does not provide any erroneous indications caused by the amount and distribution of the current flowing in the return path.

A further object of this invention is to provide a cable-testing arrangement which eliminates the need to have a separate power supply connected to the apparatus positioned at both ends of the cable.

Yet a further object of this invention is to provide an arrangement for testing cables which does not require any conductors other than those in the the cable itself for the return path.

These and other objects are achieved in accordance with this invention by establishing, at the so-called far end of the cable, a conduction path between all of the conductors and, by sequentially selecting at the so-called near end, one of n-1 of the n conductors comprising the multi-conductor cable and establishing a conduction path between it and the $n^{th}$ conductor to form a test loop comprised of only two conductors: the selected conductor and the $n^{th}$ conductor, whereby this latter conductor serves as a fixed return path.

In a specific embodiment disclosed herein, the cable testing apparatus is comprised of two units: a selector which is attached to the cable at the near end and a fault indicator which is attached to the cable at the far end. Within the fault indicator, an indicator is wired in series with each of $n-1$ of the n conductors appearing at the far end. A pulse of test current is applied to the loop by the selector. As the test current pulse flows through each of the selected conductors, its associated indicator flashes. If all n conductors are correctly wired, then all n-1 indicators flash in a predetermined sequence dictated by the order in which each of the n-1 conductors is selected. The exact nature of any wiring errors and the particular one(s) of the n conductors which are affected is indicated by those indicators which do not flash or flash out of sequence.

By using a single fixed conductor (without an indicator) as the return path, this arrangement does not provide any erroneous indications if an excessive amount of current flows through the return path.

In accordance with an aspect of this invention, the selector automatically selects in succession each of the $n-1$ conductors to be tested, thereby permitting single-person testing of long installed multi-conductor cable and thus eliminating the need to have an installer stationed at each end of the cable in order to completely test it.

BRIEF DESCRIPTION OF THE DRAWING

The invention may be clearly understood from a consideration of the following detailed description and accompanying drawing in which.

To facilitate easy understanding, identical reference numerals are used to denote identical elements common to both figures.

DETAILED DESCRIPTION

Figure 1:
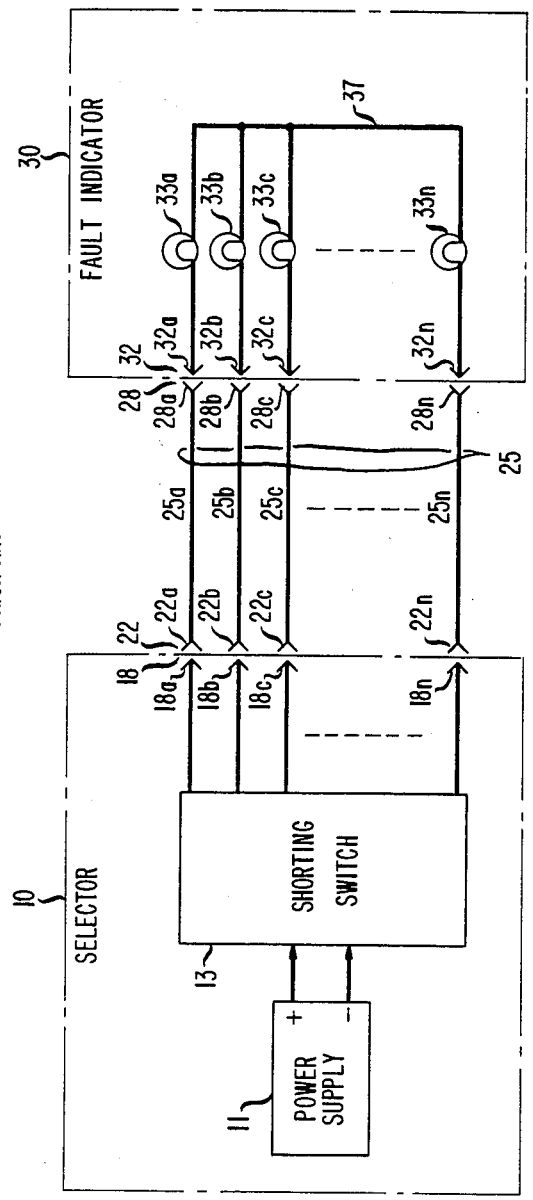
FIG. 1 is a block diagram of prior art apparatus for testing multi-conductor cable.

Cable testing apparatus of a type known to the art is depicted in FIG. 1. This apparatus is comprised of selector 10 connected to one end, i.e., the so-called near end, of multi-conductor cable 25 and fault indicator 30 connected to the other end, i.e. the so-called far end, of this cable.

Cable 25 is an installed multi-conductor cable. It is comprised of n separate conductors denoted as conductors 25a, 25b, 25c, . . . 25n. Connectors 22 and 28, comprised of terminals or pins 22a, 22b, 22c, . . . 22n and 28a, 28b, 28c, . . . 28n, respectively, are connected to the near and far ends, respectively, of this cable. Each pin of each connector may advantageously be soldered to a corresponding conductor in cable 25.

Any wiring errors detected by this apparatus, in a manner described hereinbelow, and affecting any of the conductors are visually indicated by fault indicator 30. Within fault indicator 30, one end of an incandescent lamp is wired in series, via mating connectors 28 and 32, with a corresponding one of the n conductors comprising multi-conductor cable 25. For example, one end of lamp 33a is attached via pins 32a and 28a of connectors 32 and 28, respectively, to conductor 25a. The remaining lamps are wired in a similar fashion to the remaining conductors. The other ends of all of lamps 33a through 33n are connected together via lead 37.

Selector 10 sequentially selects each of the conductors comprising cable 25 and in combination with fault indicator 30 tests the selected conductor for wiring errors. To accomplish this, selector 10 selects one of the n conductors at a time, applies a test signal to it and simultaneously therewith uses all of the remaining conductors as a return path for the applied test signal.

In particular, to test any particular conductor, illustratively, conductor 25a, the armature (not shown) of shorting switch 13, contained within selector 10, is positioned to connect conductor 25a, via pins 18a and 22a, to the positive terminal of power supply 11. Simultaneously therewith, shorting switch 13 connects all the other conductors of cable 25 to a common lead (not shown) which is located within this switch and which is in turn routed to the negative terminal of power supply 11. Consequently, a test loop is thus established which at any one time is comprised of power supply 11, the selected conductor, the indicator wired in series with the selected conductor, and the return path to power supply 11 consisting of all the remaining conductors and the series wired indicators associated therewith. Operation of this circuit can be readily understood by assuming conductor 25a contains no wiring errors. In this case, test current travels from the positive terminal of power supply 11 through shorting switch 13, through conductor 25a, to fault indicator 30 where it in turn lights lamp 33a. From there, this current distributes itself and travels through all the remaining conductors, i.e., conductors 25b, 25c, . . . 25n to reach shorting switch 13. At that point, this current is then applied to the negative terminal of power supply 11. The thoroughly test multi-conductor cable 25, each conductor comprising the cable is sequentially selected and tested in the above-described manner.

While the above-described prior art cable testing apparatus can be used to test installed multi-conductor cables, erroneous indications of wiring errors may result if the resistance of one or more conductors in the return path and/or their associated indicators is markedly lower from that of the others. In that case, the conductor (and its indicator) in the return path which has a low resistance will carry an excessive amount of the test current, possibly an amount sufficient to light the indicator wired in series with that conductor. Alternatively, if no marked resistance variation occurs, erroneous indications may result if the magnitude of the test current applied to the selected conductor is too high. Specifically, even after the test current evenly distributes itself among all the conductors comprising the return path, the amount of test current flowing through any one conductor in the return path may be sufficiently large to light its associated indicator. Thus, in either case, two or more indicators will light: the one in series with the selected conductor and the other(s) in series with one or more of the conductor(s) in the return path. The installer will perceive these lit indicators to mean that the associated conductors are shorted together—when, in actuality, they are not.

The present invention, therefore, is directed to apparatus for testing multi-conductor cables for wiring errors or conduction faults which is only minimally affected by either the amount of test current flowing through the selected conductor or by any variation in resistance among all the conductors comprising the cable and the indicators connected thereto.

Figure 2:
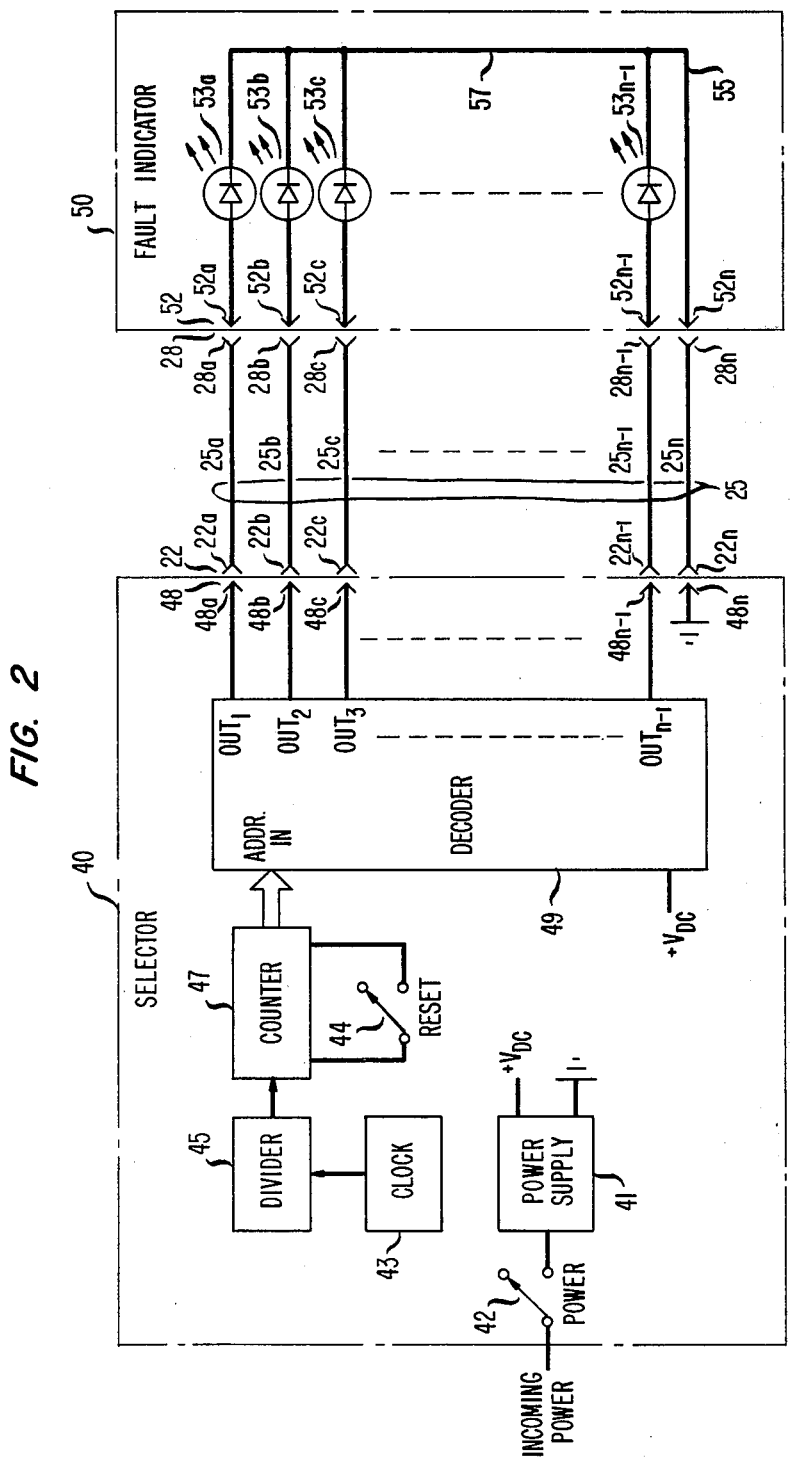
FIG. 2 is a preferred embodiment of cable testing apparatus which embodies the principles of the present invention.

FIG. 2 depicts multi-conductor cable 25 connected to a preferred embodiment of cable testing apparatus according to the principles of the invention. This apparatus is comprised of selector 40 and fault indicator 50. Cable 25 is connected to selector 40, via connector 48 which mates with connector 22, and to fault indicator 50 via connector 52, which mates with connectors 28. Selector 40 sequentially selects a particular one of $n-1$ of the n conductors and establishes a conduction path, i.e., a test loop, between it and the remaining conductor, i.e., conductor 25n. Also, simultaneously therewith, selector 40 applies a test signal to this selected conductor. Fault indicator 50 completes this test loop by establishing a conduction path between all of the $n-1$ conductors and the remaining, i.e., $n^{th}$, conductor, and, in response to the test current flowing through each conductor, visually depicts any wiring errors affecting any of the n conductors.

Selector 40 positioned at the near end is comprised of clock 43, divider 45, counter 47, decoder 49 and power supply 41. Clock 43, divider 45 and counter 47 form a binary clock pulse counter. Clock 43 produces a series of periodic clock pulses at a frequency sufficiently high (e.g. 50 kHz) such that both the capacitance and physical size of any timing capacitors associated with the clock circuit are kept advantageously small. These clock pulses are applied to divider 45 which divides their frequency by a predetermined amount. The resulting low frequency clock pulses are applied as input to binary counter 47, which continuously counts these pulses from zero to a predetermined maximum number. Reset pushbutton switch 44, when depressed, sets the then existing count to zero, and is used, as will become apparent shortly, to cause the cable testing apparatus to start the sequence, in which the conductors are tested, with conductor 25a. The rate at which the contents of counter 47 are incremented controls the rate at which the indicators in fault indicator 50 will sequentially flash. By varying, for example, the chosen frequency of clock 43, this rate can be set to any particular rate, e.g., one flash every half second, which causes any indicator(s) flashing out of sequence to be most perceptible to a user of this apparatus.

The contents of counter 47 are applied in parallel to the address inputs of decoder 49, which, in response to the current value of the count, selects a sequential one of its $n-1$ separate outputs and applies a test signal thereto. Specifically, decoder 49, as is well known in the art routes the voltage, $+V_{DC}$, appearing at the positive terminal of power supply 41 to that one of the decoder's $n-1$ outputs which corresponds to the n existing value of the digital word, i.e., the count appearing at the address inputs to the decoder. Each of the $n-1$ outputs of decoder 49 is connected via corresponding pins in mating connectors 48 and 22 to a corresponding one of the $n-1$ conductors comprising multi-conductor cable 25. The applied test signal is advantageously a voltage or current pulse of a predetermined amplitude and duration.

Within fault indicator 50, each of the $n-1$ conductors is connected to one end of a corresponding indicating device, typically a light emitting diode. For example, conductor 25a is connected via pins 28a and 52a of mating connectors 28 and 52, respectively, to one end of light emitting diode indicator 53a. The other ends of all the $n-1$ indicators are connected together via lead 57 which is in turn connected to lead 55. This latter lead is used as a return lead for all the indicators. To complete the return path to selector 40, lead 55 is connected via pins 52n and 28n of mating connectors 52 and 28, respectively, to conductor 25n of cable 25.

At the near end, conductor 25n is connected via pins 22n and 48n of mating connectors 22 and 48, respectively, to a common connection within selector 40. This common connection is also connected to the return lead of power supply 41. This supply is controlled by power switch 42 and provides the power required to operate the entire cable testing apparatus.

Thus, as can be readily appreciated, selector 40 and fault indicator 50 establish a test loop which at any time is comprised of only two conductors: the selected one of the $n-1$ conductors, and conductor 25n. Consequently, if the selected conductor contains no wiring errors, then the test current pulse applied to it by selector 40 flashes the indicator, corresponding to that conductor, within fault indicator 50 and thereafter returns to selector 40 via conductor 25n.

In operation, the above-described cable testing apparatus sequentially tests each of the $n-1$ conductors comprising cable 25, and is capable of indicating a variety of wiring errors or conduction faults affecting any of the n conductors. For example, if no wiring errors exist in the cable, all $n-1$ indicators in fault indicator 50 flash in a respective predetermined sequence. In the event one of the $n-1$ conductors is open or shorted to the $n^{th}$ conductor, its associated indicator does not flash at all. If two or more of the $n-1$ conductors are shorted together, then all the indicators associated with these shorted conductors flash at once. Crossed connections between two or more of the $n-1$ conductors are indicated by the associated indicators flashing out of sequence. If the $n^{th}$ conductor, i.e., conductor 25n in cable 25, is open, then none of the $n-1$ indicators flashes. Advantageously, only one person is required to test long installed multi-conductor cable using the above-described apparatus. As is evident from the foregoing discussions, selector 40 can automatically select each of the n−1 conductors in succession. Consequently, once an installer begins a test by attaching the selector to one end of the cable, he can thereafter leave that end unattended and complete the test by attaching the fault indicator to the other end of the cable and watching its indicators flash.

Of course, it will be appreciated by those skilled in the art that selector 40 need not be implemented as a digital circuit as described above, but could instead be any device, e.g., a rotary switch, which is capable of selecting any one circuit or wire out of many. Furthermore, the indicators need not be limited to light emitting diodes, lamps or the like, but can be any circuit, e.g., a computer, which, in response to the test signal applied to each conductor, produces an alphanumeric or digital indication of the wiring errors, if any, associated with that conductor.

In addition, the teachings of the present invention are not limited to the detection of wiring errors in multi-conductor cable. By changing both the test signal applied to each selected conductor to illustratively a square wave, a continuous frequency spectrum or pink noise, and the apparatus responsive thereto in the fault indicator, other characteristics of each conductor such as for example its frequency response, inductance, capacitance, impedance, or mutual coupling could be readily and quickly determined. Moreover, the principles of the above-described invention could well be advantageously incorporated into an automatic cable tester for use in a manufacturing facility.

Thus, many and varied arrangements incorporating the teachings of the present invention may be devised by those skilled in the art without departing from the spirit and scope of the invention.

What is claimed is:

1. Apparatus for testing a cable, having two ends and n separate conductors, for conduction faults associated with each of said conductors comprising
   means at one end for establishing a conduction path between all of n−1 conductors of said n conductors and a remaining one of said n conductors,
   means at the other end for sequentially establishing a conduction path between each of said n−1 conductors and the remaining conductor whereby loops comprised of each of said n−1 conductors and said remaining conductor are sequentially produced,
   means for causing test current to flow around each of said loops, and
   means connected to each of said n−1 conductors at said one end of said cable and responsive to the test current flowing through each said loop for indicating any conduction faults associated with any of the n conductors.

2. The invention in claim 1 in which said indicating means is comprised of
   a plurality of indicating devices each of which is wired in series with a respective one of the n−1 conductors.

3. The invention in claim 1 in which said sequential establishing mean is further comprised of
   means for sequentially selecting each of said n−1 conductors and for causing said test current to flow through the particular one of said loops comprised of the selected conductor.

4. The invention in claim 3 in which said selecting and causing means is further comprised of
   clock pulse counting means and
   means for routing said test current to a particular one of said n−1 conductors in response to the present value of said clock pulse count.

* * * * *